US00RE40743E

(19) United States
(12) Reissued Patent
Fuerter et al.

(10) Patent Number: US RE40,743 E
(45) Date of Reissued Patent: Jun. 16, 2009

(54) PROJECTION EXPOSURE SYSTEM HAVING A REFLECTIVE RETICLE

(75) Inventors: Gerhard Fuerter, Ellwangen (DE); Christian Wagner, Eersel (NL); Uwe Goedecke, Abtsgmuend (DE); Henriette Mueller, Aalen (DE)

(73) Assignee: Carl Zeiss SMT AG, Oberkochen (DE)

(21) Appl. No.: 10/916,650

(22) Filed: Aug. 11, 2004

Related U.S. Patent Documents

Reissue of:
(64) Patent No.: 6,590,718
Issued: Jul. 8, 2003
Appl. No.: 09/773,519
Filed: Feb. 2, 2001

(30) Foreign Application Priority Data

Feb. 5, 2000 (DE) ..... 100 05 189

(51) Int. Cl.
*G02B 17/00* (2006.01)

(52) U.S. Cl. ..... 359/732; 359/649; 359/726
(58) Field of Classification Search ..... 359/649–651
See application file for complete search history.

(56) References Cited

U.S. PATENT DOCUMENTS

| | | | | |
|---|---|---|---|---|
| 4,666,292 | A | | 5/1987 | Imamura |
| 4,701,035 | A | * | 10/1987 | Hirose ..... 359/366 |
| 4,964,705 | A | | 10/1990 | Markle |
| 5,486,851 | A | | 1/1996 | Gehner |

(Continued)

FOREIGN PATENT DOCUMENTS

| | | |
|---|---|---|
| EP | 1 191 378 | 3/2002 |
| JP | 61053646 | 3/1986 |
| JP | 6110213 | 4/1994 |
| JP | 06215997 | 8/1994 |
| JP | 09017719 | 1/1997 |
| WO | WO-93/09469 | 5/1993 |
| WO | WO-97/34171 | 9/1997 |
| WO | WO-01/04682 | 1/2001 |
| WO | WO-03/036361 | 5/2003 |

OTHER PUBLICATIONS

"Lithography for 0.25 μm and below using simple high–performance optics" by Pease et al., IEEE Symp. VLSI Technology (1992), pp. 116 and 117.
"⅛ μm optical lithography" Owen et al., J. Vac. Sci. B 10 (1992), pp. 3032 to 3036.
"Optical projection system for gigabit dynamic random acess memories" by Jeong et al. J. Vac Sci. B 11 (1993), pp. 2675 to 2679.

*Primary Examiner*—Jordan M. Schwartz
(74) *Attorney, Agent, or Firm*—Darby & Darby P.C.

(57) ABSTRACT

A projection exposure system for microlithography includes an illuminating system (2), a reflective reticle (5) and reduction objectives (71, 72). In the reduction objective (71, 72), a first beam splitter cube (3) is provided which superposes the illuminating beam path (100) and the imaging beam path (200). In order to obtain an almost telecentric entry at the reticle, optical elements (71) are provided between beam splitter cube (3) and the reflective reticle (5). Advantageously, the reduction objective is a catadioptric objective having a beam splitter cube (3) whose fourth unused side can be used for coupling in light. The illuminating beam path (100) can also be coupled in with a non-parallel beam splitter plate. The illuminating beam path is refractively corrected in passthrough to compensate for aberrations via the special configuration of the rear side of the beam splitter plate. Advantageously, a beam splitter plate of this kind is used within a reduction objective in lieu of a deflecting mirror and only refractive components are introduced between the beam splitter plate and the reflective reticle.

40 Claims, 8 Drawing Sheets

U.S. PATENT DOCUMENTS

| | | | |
|---|---|---|---|
| 5,742,436 | A | 4/1998 | Furter |
| 5,861,997 | A | 1/1999 | Takahashi |
| 5,880,891 | A | 3/1999 | Furter |
| 5,956,174 | A | 9/1999 | Shafer et al. |
| 5,971,577 | A | 10/1999 | Mori et al. |
| 5,982,558 | A | 11/1999 | Furter et al. |
| 6,122,037 | A | 9/2000 | Wagner |
| 6,340,821 | B1 | 1/2002 | Brown |
| 6,600,608 | B1 | 7/2003 | Shafer et al. |
| 2003/0011755 | A1 | 1/2003 | Omura et al. |
| 2003/0197946 | A1 | 10/2003 | Omura |

* cited by examiner 5
91
200
100
47
48
92
93
94
95
96
97
98
6
16
200
36
360
200
15
2
1
100

PROJECTION EXPOSURE SYSTEM HAVING A REFLECTIVE RETICLE

Matter enclosed in heavy brackets [ ] appears in the original patent but forms no part of this reissue specification; matter printed in italics indicates the additions made by reissue.

FIELD OF THE INVENTION

The invention relates to a projection exposure system having a reticle which operates in reflection.

BACKGROUND OF THE INVENTION

Projection exposure systems having a reflective reticle have been used in the past, inter alia, together with 1:1 Dyson objectives. These projection exposure systems are described in the following publications:

a) Owen et al, "⅛ μm optical lithography" J. Vac. Sci. B 10 (1992), pages 3032 to 3036, especially Parts B and C;

b) Pease et al, "Lithography for 0.25 μm and below . . . " IEEE Symp. VLSI Technology (1992), pages 116 and 117;

c) Jeong et al, "Optical projection system . . . " J. Vac. Sci. B 11 (1993), pages 2675 to 2679; and, d) U.S. Pat. No. 4,964,705.

The incoupling of the illumination takes place via a partially transmitting mirror as shown, for example, in U.S. Pat. No. 4,964,705 (FIGS. 3A and 3B). Beam splitter cubes or beam splitter plates are not provided in these designs.

Reflective reticles are used exclusively in the area of lithography utilizing soft X-rays (EUVL). The beam splitting of illuminating and imaging beam paths is realized by an inclined incidence of the illumination. Beam splitter cubes or beam splitter plates are not used. The objectives are pure mirror objectives having a non-axial symmetrical beam path. The inclined incidence of the illuminating light on the reflective reticle has the disadvantage that the raised mask struts lead to vignetting.

Japanese patent publication 9-017719 discloses a wafer projection exposure system having a reflex LCD as a special reticle. According to FIG. 1 of this publication, a planar beam splitter plate is used to separate the illuminating and imaging beam paths. Illuminating system and projection objective are operated with a field symmetrical to the optical axis. The incoupling of the illuminating light via a beam splitter plate directly ahead of the reticle as shown in Japanese patent publication 9-017719 requires, on the one hand, the corresponding entry intersection distance, and, on the other hand, the passthrough through the planar plate leads to the astigmatic deformation of the illuminating light between which disturbs the required clean pupil imaging.

U.S. Pat. No. 5,956,174 discloses a catadioptric microscope objective wherein the illuminating light is coupled in via a beam splitter cube between the microscope objective and the tube lens. This type of illumination is conventional in reflected light microscopes. The illuminating field sizes are only in the order of magnitude of 0.5 mm.

Catadioptric systems for wavelengths of 193 nm and 157 nm are known. Catadioptric projection objectives having beam splitter cubes without an intermediate image are shown, for example, in U.S. Pat. Nos. 5,742,436 and 5,880,891 incorporated herein by reference.

Catadioptric projection objectives having a beam splitter cube and an intermediate image are disclosed in U.S. Pat. No. [06/424,471] *6,424,471*.

Illuminating devices for microlithography are disclosed in U.S. Pat. No. 5,675,401 and U.S. Pat. No. 6,285,443.

So-called REMA objectives for imaging a reticle masking device (REMA) into the plane of the reticle are disclosed in U.S. Pat. No. 5,982,558 and U.S. Pat. No. 6,366,410, also incorporated herein by reference. With these objectives, inter alia, the entry pupil of the downstream projection objective is illuminated.

The production of transmission reticles (that is, masks operated in transmission for microlithography) is difficult for deep ultraviolet wavelengths, especially 157 nm, inter alia, because of suitable transmitting carrier materials. The materials $CaF_2$ or $MgF_2$ can be considered. However, reticles made of $CaF_2$ or $MgF_2$ are difficult to process and are therefore very expensive. Furthermore, a reduction of the minimal structural size which can be applied to a semiconductor chip results because of absorption and the thermal expansion of the reticle resulting therefrom when there are multiple illuminations. When possible, materials such as $MgF_2$ are avoided because they are also double refracting.

The alternative are reflective reticles. To reduce the requirements imposed on the reticle, it is advantageous when the projection objective is configured as a reduction objective and the reticle is imaged so as to be demagnified. The reticle can then be provided with larger structures.

In conventional reduction objectives, the use of reflective reticles is not easily possible. The typical entry intersection distance of, for example, 30 mm reduces the illumination at suitable angles of incidence.

SUMMARY OF THE INVENTION

It is an object of the invention to provide a projection exposure system having a reduction objective which functions without problem with reflective reticles.

The projection exposure system of the invention is for microlithography and includes: a light source; an illuminating system mounted downstream of the light source for transmitting light from the light source as an illuminating beam along an illuminating beam path; a reflective reticle; a reduction objective defining an imaging beam path and being configured for imaging the reticle onto an object; and, a beam splitter cube mounted in the imaging beam path for mutually superposing the illuminating beam path and the imaging beam path.

According to a feature of the invention, a beam splitter cube functions to superpose the illuminating and imaging beam paths. In this way, numerous objective design concepts for reflective reticles can be adapted as will be shown in the following examples. Erroneous entries by the beam splitter plate are avoided by utilizing a beam splitter cube in lieu of a planar parallel beam splitter plate. The beam splitter plate is operated in passthrough and mounted at 45°.

According to another feature of the invention, optical elements are provided between the beam splitter cube and the reticle. With these optic elements, it is possible to reduce the angle of incidence of the main beams of the reduction objective on the reticle in such a manner that the incident angle has values between −15 mrad and +15 mrad.

According to still another feature of the invention, the illuminating system is so configured that the illuminating beam path passes over into the imaging beam path with deviations of less than ±2.5 mrad. This deviation can be measured in that the angles with respect to the reticle plane are determined for the centroidal rays after the reflection and the deviation to the angles of the corresponding chief rays is computed. The angles of the centroidal rays are dependent upon the emission characteristics of the light source and the design of illuminating system and the angles of the chief ray are exclusively dependent upon the design of the reduction objective.

According to another feature of the invention, a polarization beam splitter cube is used in order to reduce transmission losses at the beam splitter cube and so that no scattering light is deflected onto the wafer. For an optimal operation, the illuminating light should be linearly polarized to more than 95%. The polarization direction is dependent upon whether the illuminating beam path is intended to be reflected or not at the beam splitter layer. In the case of a reflection, the illuminating light has to be polarized parallel to the beam splitter surface and, in the case of the transmission, the illuminating light has to be polarized perpendicularly to the beam splitter surface.

In other embodiments of the invention, the beam splitter cube functions exclusively for incoupling the illuminating beam path. To be able to more easily integrate the beam splitter cube into the design of the reduction objective, it is advantageous to subdivide the reduction objective into two component objectives with a first intermediate image having an imaging scale of −1.0±0.25 and a second image having an imaging scale of −0.25±0.15. The beam splitter cube is integrated into the first intermediate image. The second image can be configured to be strictly refractive or catadioptric.

The coupling in of the illuminating beam path with a beam splitter cube is especially advantageous when the beam splitter cube is already a part of the reduction objective. Then, the fourth unused face of the beam splitter cube can be used to couple in the illuminating beam path.

If the design of the catadioptric objective includes a deflecting mirror, then the deflecting mirror can be replaced by a beam splitter cube via which the illuminating light is coupled in.

The design of the catadioptric objective can be configured with or without an intermediate image.

In another embodiment of the invention, a special beam splitter plate is provided in the projection exposure system. This beam splitter plate is operated in pass through in the illuminating beam path and is operated reflectively in the imaging beam path. Here, reflection in air is provided, that is, in the optically thinner medium which can also be a vacuum or a special gas mixture or a gas such as nitrogen or helium. The beam splitter plate is so configured that astigmatic errors because of the plate mounted at an angle can be refractively corrected.

The common inventive concept is that the imaging beam path is held free of disturbances by the beam splitter arrangement and the illuminating beam path is corrected with less requirements directly via the beam splitter arrangement. For a beam splitter cube, only rotationally-symmetrical imaging errors are introduced which can be corrected within the illuminating system via rotationally-symmetrical optical elements such as spherical lenses. In the beam splitter plate according to a feature of the invention, the correction of the illuminating beam path is provided by the special configuration of the side of the beam splitter plate facing toward the illuminating system.

According to still another feature of the invention, the beam splitter plate is provided with a non-planar corrective surface. By mounting the beam splitter plate at an angle, the corrective surface exhibits no rotational symmetry, rather, a simple symmetry with respect to the meridian plane.

The beam splitter plate is configured to have a wedge shape in accordance with another embodiment of the invention for correcting the astigmatism of the lowest order. The use of a beam splitter plate is especially advantageous when it is used in lieu of a deflecting mirror provided in the design of the reduction objective.

The superposition of the illuminating optics and the projection optics make possible the use of reflective reticles especially at operating wavelengths in the range from 100 to 200 nm. In this way, the difficulties are avoided which occur in the manufacture of transmission reticles because of machining of the materials transparent at these wavelengths.

BRIEF DESCRIPTION OF THE DRAWINGS

The invention will now be explained with reference to the drawings wherein.

DESCRIPTION OF THE PREFERRED EMBODIMENTS OF THE INVENTION

Figure 1:
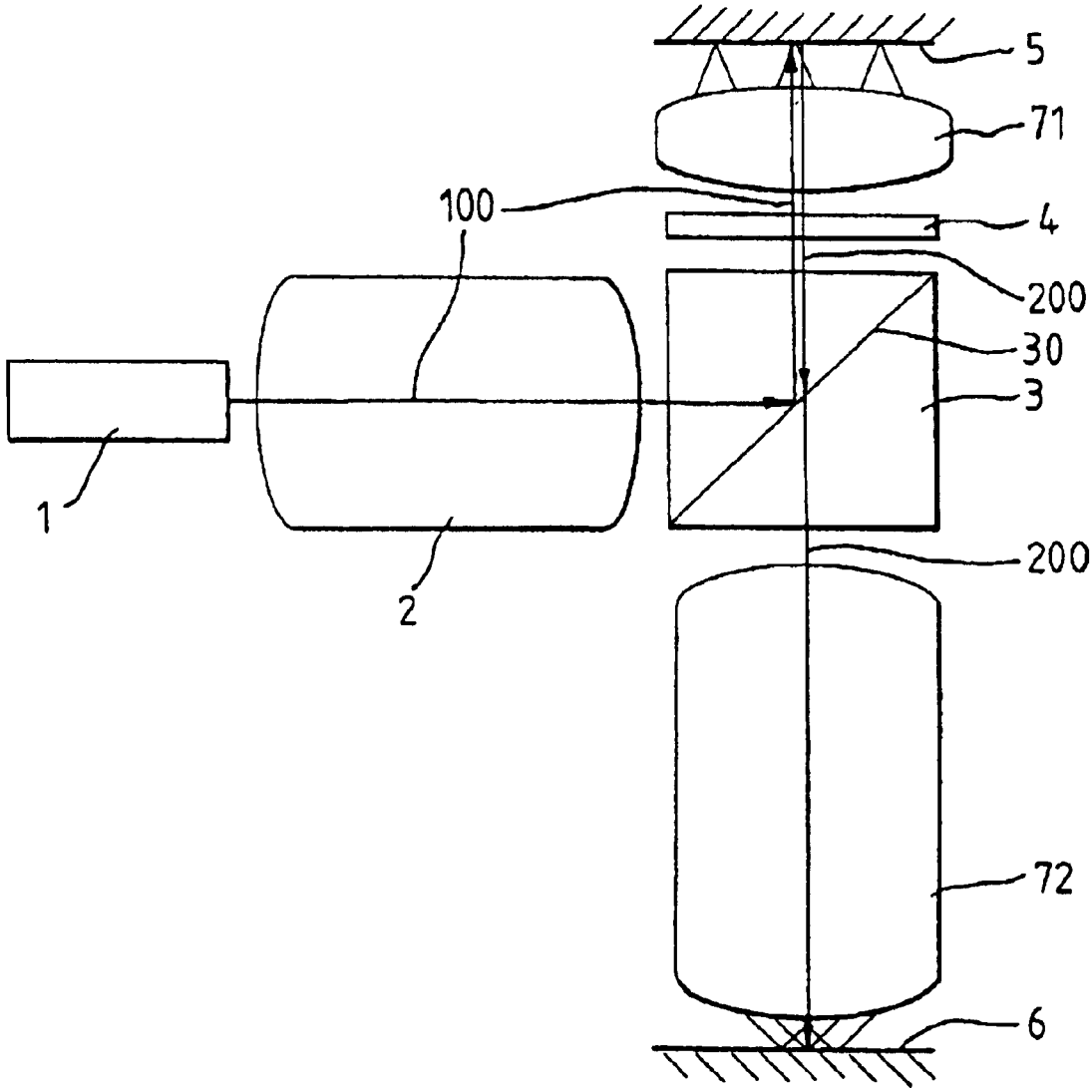
FIG. 1 is a schematic of a reduction objective having a reflective reticle and a beam splitter cube for coupling in the illumination light.

FIG. 1 shows a typical configuration of a projection exposure system for microlithography in accordance with an embodiment of the invention. The reflective reticle 5 is imaged via demagnifying imaging optics onto the wafer 6 at a typical imaging scale β of −0.25±0.15. The illuminated field on the wafer 6 has a diameter of at least 10 mm. Rectangular fields having an x-y aspect ratio of 1:1 to 1:4 are typical. The image end numerical aperture is greater than 0.5. The imaging takes place via the optical elements 71 and 72. A beam splitter cube 3 is integrated into the imaging beam path 200 of the reduction objective between reflective reticle 5 and wafer 6 for illuminating the reflective reticle 5. The beam splitter cube can, for example, be a polarization beam splitter cube wherein a layer system is located between the prism surfaces. This layer system almost completely reflects polarized light parallel to the beam splitter surface 30; however, the beam splitter surface 30 is light transmissive for polarized light perpendicular to the beam splitter surface 30.

A condition precedent for the arrangement of FIG. 1 is therefore that the illuminating light is polarized in parallel to the incidence plane of the beam splitter surface 30 mounted at an angle of 45°. Polarized light of this kind is reflected at the beam splitter surface 30 and is deflected in the direction of reflective reticle 5. A λ/4 plate 4 is mounted between the beam splitter cube 3 and the reflective reticle 5 and this plate 4 is run through a total of two times. The first time is in the illuminating beam path 100 so that the linearly polarized light is polarized circularly. After the reflection at the reticle 5, the circularly polarized light in the imaging beam path 200 runs the second time through the λ/4 platelet 4 and is now again linearly polarized. The polarization direction now, however, is aligned perpendicular to the beam splitter surface 30 of the beam splitter cube 3 so that the beam splitter cube 3 is passed through without reflection. In this way, a separation of the illuminating light beam path 100 and of the imaging beam path 200 is provided in the combination of the following: polarization beam splitter cube 3, two-time passthrough of the λ/4 platelet 4 and the reflective reticle 5. A plane-parallel beam splitter plate would have the disadvantage compared to the polarization beam splitter cube 3 that rotationally-symmetrical imaging errors would not be introduced by the beam splitter plate of finite thickness positioned at an angle of 45°.

The polarization beam splitter cube 3 should be mounted within the imaging beam path 200 at a location at which the rays impinging on the beam splitter surface 30 exhibit a slight divergence. This is the case when the polarization beam splitter cube 3 is disposed at a location having an almost collimated beam path. For this reason, optical elements 71 having an overall positive refractive power are to be provided between reflective reticle 5 and the polarization beam splitter cube 3. The optical elements 71 essentially collimate the diverging beam coming from the reticle. The optical elements 72 can, in accordance with the type of design, be configured differently but also likewise have a positive refractive power in order to achieve imaging on a possible intermediate image plane or on the wafer plane 6.

One can view the optical elements 71 and 72 taken together as a refractive reduction objective having a typical imaging scale β of −0.25±0.15. In the design of the refractive objective, the λ/4 platelet 4 and the beam splitter cube 3 are to be provided between the optical elements 71 and the optical elements 72.

The reflective reticle 5 is illuminated with the aid of the illuminating system 2. In the design of the illuminating system 2, the beam splitter cube 3, the λ/4 platelet 4 and the optical elements 71 need be considered. The interface between the illuminating system 2 and the imaging optic is therefore not the reticle 5 as would be the case in a transmission reticle or when there is an inclined illumination of the reticle; instead, the interface is the input of the beam splitter cube 3 facing toward the illuminating system 2.

In order to simplify the optical configuration of the illuminating optics 2, it is advantageous when the chief ray angles are less than ±15 mrad with reference to the reticle plane, that is, the reticle 5 is virtually telecentrically illuminated. The chief rays are so defined in the reduction objective that they intersect the optical axis at the location of the system diaphragm. For larger chief ray angles, the design of the illuminating optics 2 is thereby made more difficult because the centroidal rays of the illuminating beam path 100 have to pass in the reticle plane 5 into the chief rays of the imaging beam path 200. Because of the reflection at the reticle, the incident angles of the centroidal rays have to exhibit the reverse sign from the incident angles of the chief rays. In this way, the illuminating beam path 100 is different from the imaging beam path 200 within the optical components 71. The distribution of the chief ray angles over the illuminated field has to be overcompensated by the illuminating system 2. The chief ray angle distribution at the reticle 5 is determined primarily by the optical elements 71 and these optical elements 71 are fixedly pregiven for the design of the illuminating system 2. For these reasons, optical components have to be provided in the illuminating system 2, such as a sequence of converging and diverging lenses, which operate on the centroidal ray angle on the reticle 5.

The optical components in the illuminating system 2 are so configured that the centroidal rays of the illuminating beam path 100, after the reflection at the reflective reticle 5, are coincident with the chief rays up to a maximum angle deviation of ±2.5 mrad depending upon field height. The chief rays are pregiven by the design of the reduction objective. Otherwise, the usually required telecentricity in the wafer plane 6 is deteriorated.

The illuminating system 2 has to have a unit for changing the polarization state of the illuminating light. In linearly polarized light of the source 1, the polarization direction has to be rotated, as required, for example, via double refracting crystals or double refracting foils. For unpolarized light of the source 1, polarizers are used for generating light which is polarized perpendicularly or parallely to the beam splitter surface 30. Preferably, these components for influencing the state of polarization are introduced directly forward of the polarization beam splitter cube 3. The polarization direction is dependent upon whether or not the illuminating beam path 100 should be reflected at the beam splitter layer 30. In the case of a reflection, for example, the illuminating light has to be polarized parallel to the beam splitter surface 30.

Conventionally, the illuminating system 2 includes integrators for homogeneously illuminating the reticle plane 5. The integrators are, for example, honeycomb condensers, hollow conductors or glass rods. For varying the illumination mode, the illuminating system can include: two zoom optics, axicon elements, filter plates in the pupillary planes and/or masking devices in the pupillary field planes or in the intermediate field planes.

The operation of these elements is disclosed, for example, in U.S. Pat. No. 6,285,443, and incorporated herein by reference. Objectives within the illuminating system 2 for adapting the centroidal ray angles of the illuminating beam path 100 to the chief ray angles of the reduction objective are known as REMA objectives for the correct illumination of the entry pupil of the reduction objective from U.S. Pat. No. 6,366,410 and from U.S. Pat. No. 5,982,558, both incorporated herein by reference.

As a light source, a DUV laser or VUV laser can be used, for example, an ArF laser at 193 nm, a $F_2$ laser at 157 nm, an $Ar_2$ laser at 126 nm and a NeF laser at 109 nm.

Figure 2:
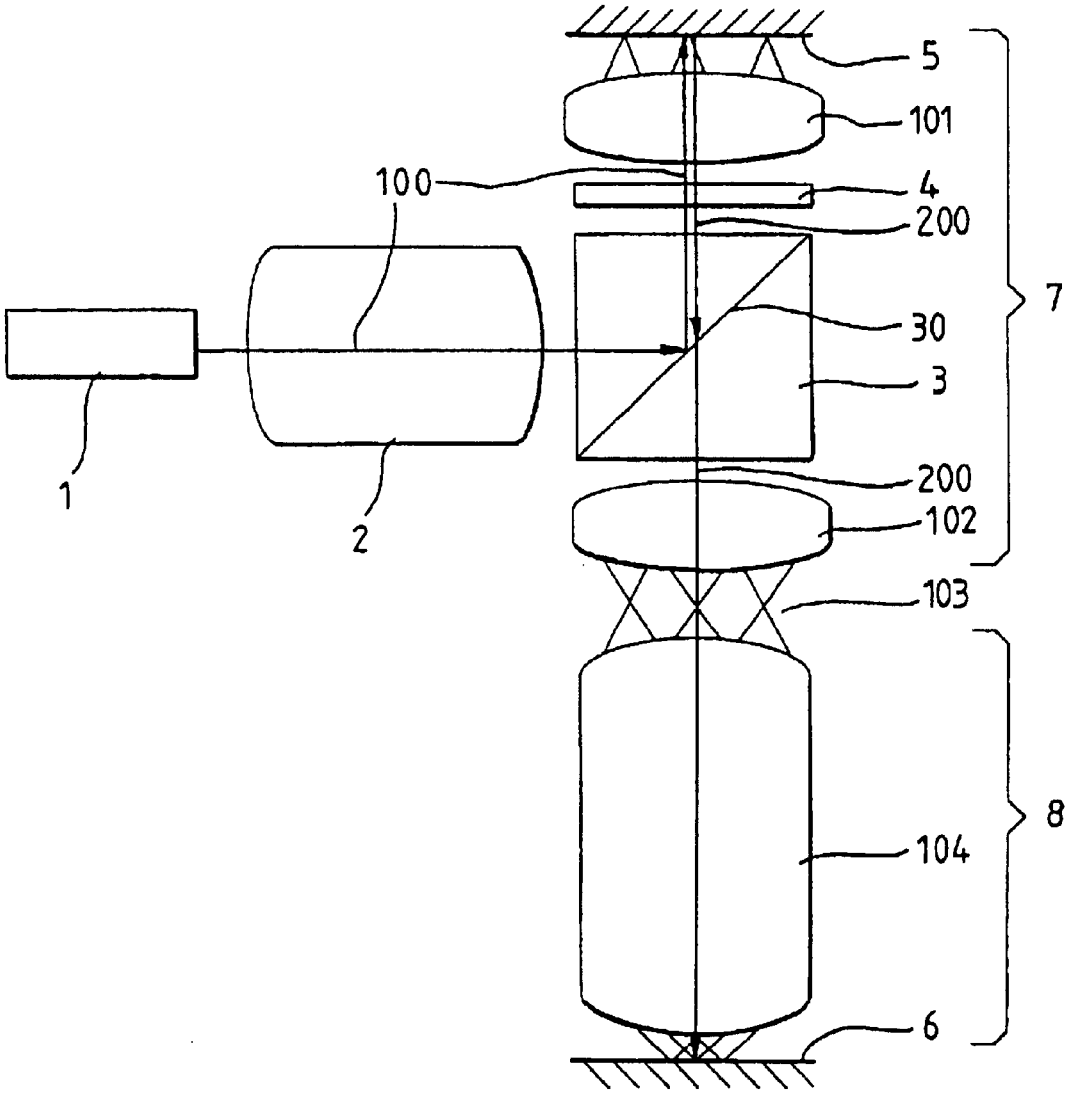
FIG. 2 shows a reduction objective with an intermediate imaging optic disposed ahead of the reduction objective and with a beam splitter cube being integrated for coupling in illumination.

FIG. 2 shows a further embodiment of the projection exposure system of the invention for microlithography. Components in FIG. 2 which correspond to those in FIG. 1 are identified with the same reference numerals. The imaging system (7, 8) in FIG. 2 includes an intermediate image plate 103. The intermediate imaging system 7 includes the optical elements 101, the λ/4 platelet 4, the polarization beam splitter cube 3 and the optical elements 102. The intermediate imaging system 7 then provides an intermediate imaging of the reflective reticle 5 onto the intermediate image plane 103. The imaging scale $\beta_1$ of this intermediate imaging can, for example, be $\beta_1=-1.0\pm0.2$. Also possible is a reduction imaging at an imaging scale, $\beta_1=-0.5\pm0.2$ if thereby the design of the downstream optical system 8 is simplified. In this case, the incoupling of the illuminating light takes place via the polarization beam splitter cube 3 with the downstream λ/4 platelet 4 within the intermediate imaging optics 7. The optical elements 101 and 102 each have a positive refractive power. The polarization beam splitter cube 3 is disposed in a region having an almost collimated beam path. Optical elements 104 follow the intermediate image plane 103 and image the intermediate image plane 103 onto the wafer plane 6 at an imaging scale of $B_2=-0.25\pm0.15$ or $\beta_2=0.5\pm0.15$. In this embodiment, the reduction objective is subdivided into the intermediate imaging system 7 and the reduction system 8. This affords the advantage that, in the intermediate imaging system 7, adequate space is provided for the polarization beam splitter cube 3. Also in this configuration, the optical elements 101, the λ/4 platelet 4 and the beam splitter cube 3 are included in the design of the illuminating system 2. It is advantageous when the intermediate imaging optics 7 are so configured that the reflective reticle 5 is almost entirely telecentrically illuminated. The angles of incidence of the chief rays on the reflective reticle 5 should then be less than 15 mrad.

Figure 3:
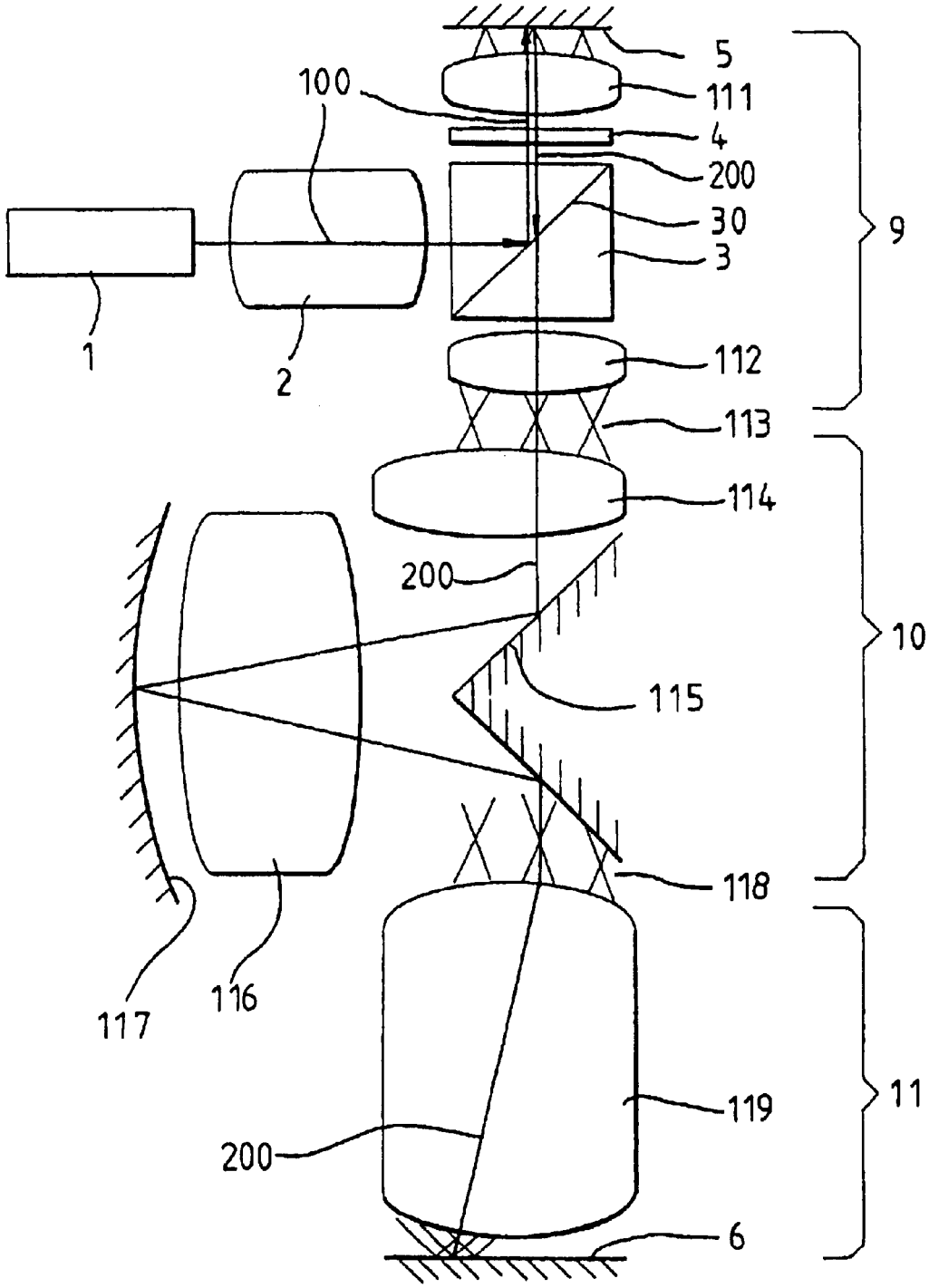
FIG. 3 shows a catadioptric reduction objective having an intermediate imaging optic disposed forward thereof into which the beam splitter cube is integrated for coupling in illumination.

FIG. 3 shows an additional embodiment of the projection exposure system of the invention for microlithography. The imaging between reflective reticle 5 and wafer plane 6 takes place with two intermediate image planes 113 and 118. The intermediate imaging system 9 of reflecting reticle 5 to intermediate image plane 113 is configured similarly to the intermediate imaging system 7 of FIG. 2. The imaging of intermediate image plane 113 on the wafer 6 takes place first with the aid of the catadioptric intermediate imaging system 10 and a downstream refractive reduction system 11. The catadioptric intermediate imaging system 10 comprises the optical elements 114, a deflecting mirror 115, the optical elements 116 and the concave mirror 117. The object field of the intermediate imaging system 10 is not centered with respect to the optical axis because of the reflective deflecting mirror 115; instead, the object field is outside of the optical axis. This means in this case that the component systems 10 and 11 must be arranged offset to the component system 9. For these projection objectives, the image end numerical aperture can have values in the range from 0.65 to 0.8 or more. Field sizes in the wafer plane 6 in the range from 20 mm×7 mm to 30 mm×10 mm are possible. Objectives of this kind are disclosed in U.S. Pat. No. 6,496,306, and incorporated herein by reference.

The incoupling of the illuminating beam path 100 into the imaging beam path 200 can be done in an especially advantageous manner when a beam splitter cube is already provided in the imaging beam path 200 as is the case in some catadioptric objective types. Catadioptric objective types having beam splitter cubes are known in various configurations.

Figure 4:
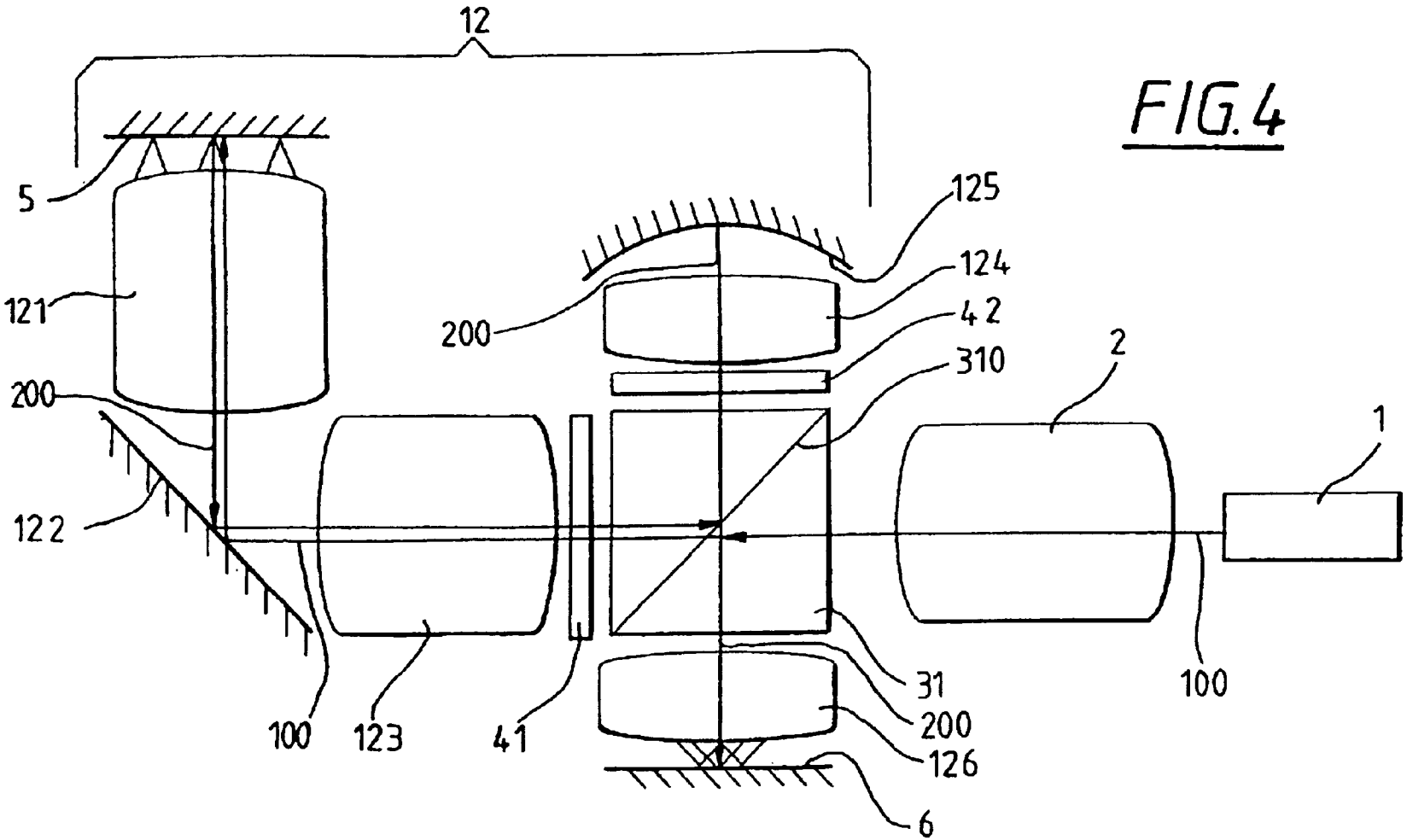
FIG. 4 shows a catadioptric reduction objective without an intermediate imaging optic wherein the illuminating beam path is coupled in via the beam splitter cube of the catadioptric reduction objective.

FIG. 4 shows a possible catadioptric projection objective having a beam splitter cube 31 which is assembled without an intermediate image. Objectives of this kind comprise, starting with the reticle 5: a first lens group 121, a deflecting mirror 122, a second lens group 123, the beam splitter cube 31, a third lens group 124, a concave mirror 125, a fourth lens group 126 and a diaphragm which is arranged between the elements 123 and 126. For these objectives, the following can be considered: an imaging scale β of −0.25±0.15; an image end numeric aperture of >0.5; and, an image field diameter >10 mm, preferably >20 mm.

The first lens group 121 and the second lens group 123 can be so arranged that the divergence of the rays on the beam splitter surface 310 of the polarization beam splitter cube 31 is minimized. If one views a peripheral ray which originates from an object point on the optical axis, then the sine of the angle of this ray with respect to the optical axis can be reduced up to 40% by the first and second lens groups 121 and 123. The lens group 124 must have a negative refractive power in order to obtain an adequate color correction together with the concave mirror 125. The lens group 126 generates the image in the wafer plane 6 and therefore exhibits a positive refractive power. The reduction objective 12, which is shown in FIG. 4, comprises the optical elements 121, 122, 123, 124, 125, 126 and the beam splitter cube 31. This reduction objective 12 is taken from U.S. Pat. No. 5,880,891 incorporated herein by reference.

If one now uses this objective type with a reflective reticle 5, then the illuminating light can be coupled in via the polarization beam splitter cube 31. Advantageously, the fourth unused face of the polarization beam splitter cube 31 is used for this purpose. It is absolutely necessary that the illuminating light is polarized more than 95% perpendicularly to the beam splitter surface 310 so that no illuminating light is reflected at the beam splitter surface 310 in the direction of wafer 6 so that thereby contrast and resolution are not reduced. For this reason, it is advantageous to build in a polarization filter between illuminating system 2 and polarization beam splitter cube 31. The polarization filter has a transmissive polarization direction which is orientated perpendicular to the beam splitter surface 310.

A first λ/4 platelet 41 follows the polarization beam splitter cube 31. The light beams of the illuminating beam path 100 are circularly polarized with the aid of this first λ/4 platelet 41. The light beams of the imaging beam path 200 run from the reflective reticle 5 to the wafer 6 and are, in turn, linearly polarized by the λ/4 platelet 41 but parallel to the beam splitter surface 310 and are reflected at the beam splitter surface 310 to the concave mirror 125. Before the light beams impinge on the concave mirror 125, the beams are circularly polarized by a second λ/4 platelet 42 and, after the reflection at the concave mirror 125 with the second passthrough, are linearly polarized by the second λ/4 platelet 42 again parallel to the beam splitter layer 310 so that the light beams pass through the polarization beam splitter cube 31 in the direction of wafer 6.

Except for the first λ/4 platelet 41 between polarization beam splitter cube 31 and reticle 5, a conventional catadioptric reduction objective 12 having a polarization beam splitter cube 31 can be used unchanged with the reflective reticle 5. What is decisive is that, in the design of the illuminating system 2, the optical elements of the projection objective, which are likewise passed through by the illuminating light, also have to be considered.

The light of the light source 1 is so configured in the illuminating unit 2 that it illuminates the reflective reticle 5 in correspondence to the lithographic requirements after passing through the following: the polarization beam splitter cube 31, the first λ/4 platelet 41, the second lens group 123, the deflecting mirror 122 and the first lens group 121. The homogeneity of the illumination and the illuminating mode is made available by corresponding components in the illuminating system 2. The illuminating mode includes coherent, incoherent, annular or quadrupole illumination. In order to correctly illuminate the entry pupil of the reduction objective 12, the polarization beam splitter cube 31 and the optical elements 121 to 123 are considered as fixed components of the illuminating beam path 100 and their effect is to be considered in the design of the illuminating system 2.

Figure 5:
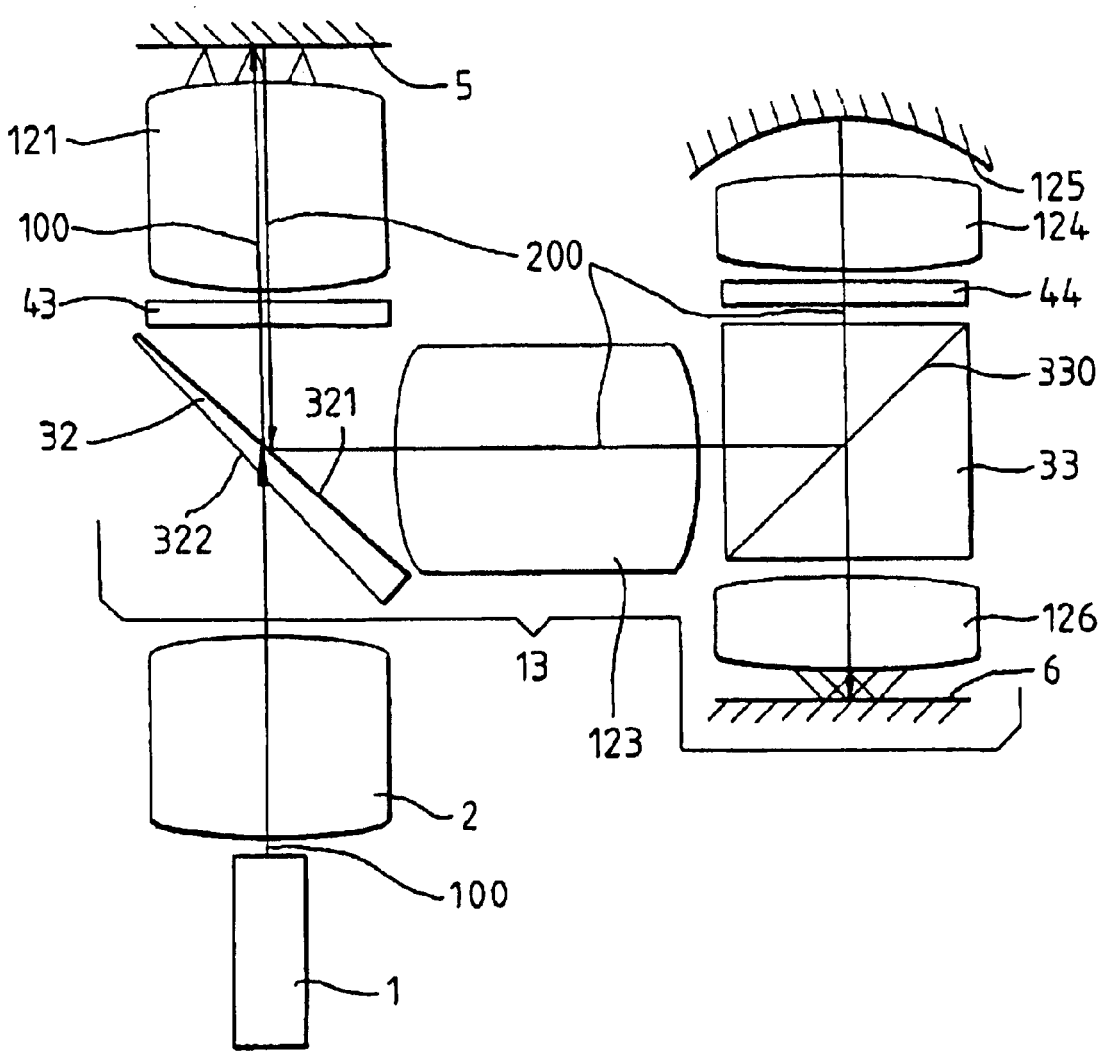
FIG. 5 shows a catadioptric reduction objective without an intermediate imaging optic where the illumination is coupled in via a beam splitter plate at the location of the deflection.
Figure 6:
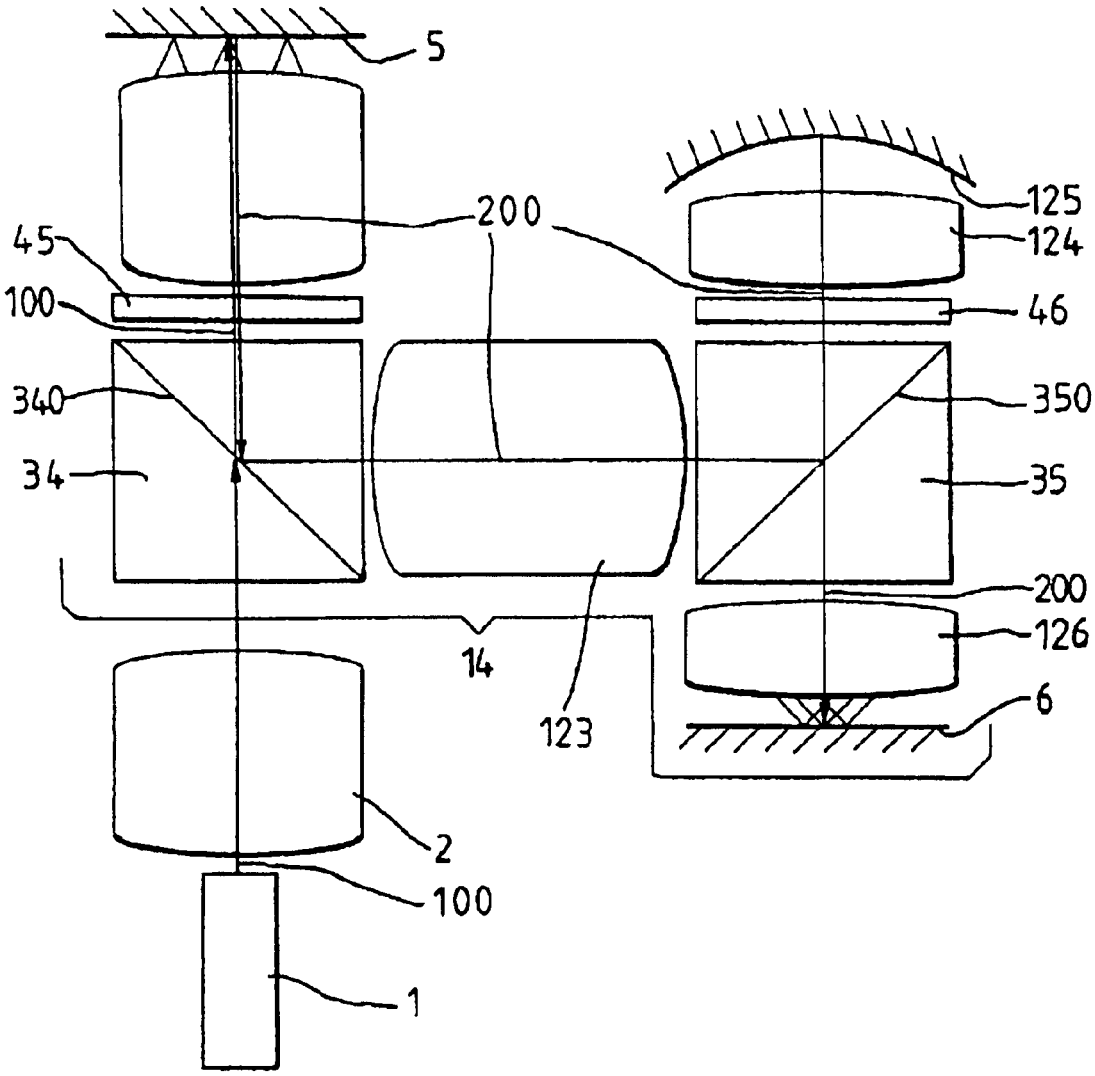
FIG. 6 shows a catadioptric reduction objective without an intermediate imaging optic wherein the illumination is coupled in via a beam splitter cube at the location of the deflection.

In the configuration of the reduction objective 12 of FIG. 4, it is also possible to couple in the illumination light 100 via the deflection mirror 122 as shown in FIGS. 5 and 6.

In FIG. 5, the deflecting mirror 122 of FIG. 4 is replaced by a polarization beam splitter plate 32. The illuminating light 100 should be so polarized that it passes through the polarization beam splitter plate 32. A λ/4 platelet 43 is disposed between polarization beam splitter plate 32 and the reticle 5 and leads to the circular polarization of the illuminating light 100. After the reflection at reticle 5, the light beams of the imaging beam path 200 are polarized when passing through the λ/4 platelet 43 parallel to the beam splitter surface 321 so that the beam is reflected in the direction of polarization beam splitter cube 33. The use of a known planes parallel beam splitter plate, which is positioned in the beam path 200 at an angle of 45°, would lead within the illuminating beam path 100 to non-rotationally symmetrical imaging errors such as astigmatism and coma in the axis. For this reason, the beam splitter plate 32 of the invention is utilized. This plate is configured as a wedge plate such that the astigmatism of lowest order can be completely eliminated by an optimized wedge angle. The wedge angle is so configured that the thicker end of the wedge is directed toward the illuminating system 2 and the thinner end is directed toward the reticle 5.

The remaining imaging errors of higher order can be compensated by a targeted aspherization of the surface 322 facing toward the illuminating system 2. The aspherization can, for example, be undertaken by an ion beam or a robotic refinement. The aspheric shape is then, as a rule, not rotationally symmetric; instead, the aspheric form has a simple symmetry. The symmetry plane is the meridian plane. A correction of this kind via the wedge plate and the aspherized surface 322 is adequate within the illuminating beam path 100 in order to achieve the required specification for the correct illumination of the reticle 5. In contrast, within the imaging beam path 200, the use of a polarization beam splitter plate 32 in transmission would not be possible because of the introduced imaging errors. In a configuration of FIG. 5, no adverse effect on the imaging beam path 200 occurs because, in the imaging beam path 200, only the planar surface 321 of the beam splitter plate 32 is used in reflection so that the light rays of the imaging beam path 200 are reflected by air. With air, a medium having a refractive index of almost 1.0 is understood. In this connection, consideration can be given also to gas fillings, for example, with nitrogen, helium or partially evacuated air spaces.

The deflection mirror 122 in FIG. 4 or the beam splitter plate 31 in FIG. 5 can also be replaced by a polarization beam splitter cube 34 as shown in FIG. 6. A polarization beam splitter cube 34 has the advantage compared to a beam splitter plate 32 that only rotationally symmetrical imaging errors are introduced which can be easily corrected. In comparison to the beam splitter plate 32, a beam splitter cube 34 has the advantage that the additional glass path through the glass prisms leads to transmission losses which are disturbing especially at low wavelengths.

Figure 7:
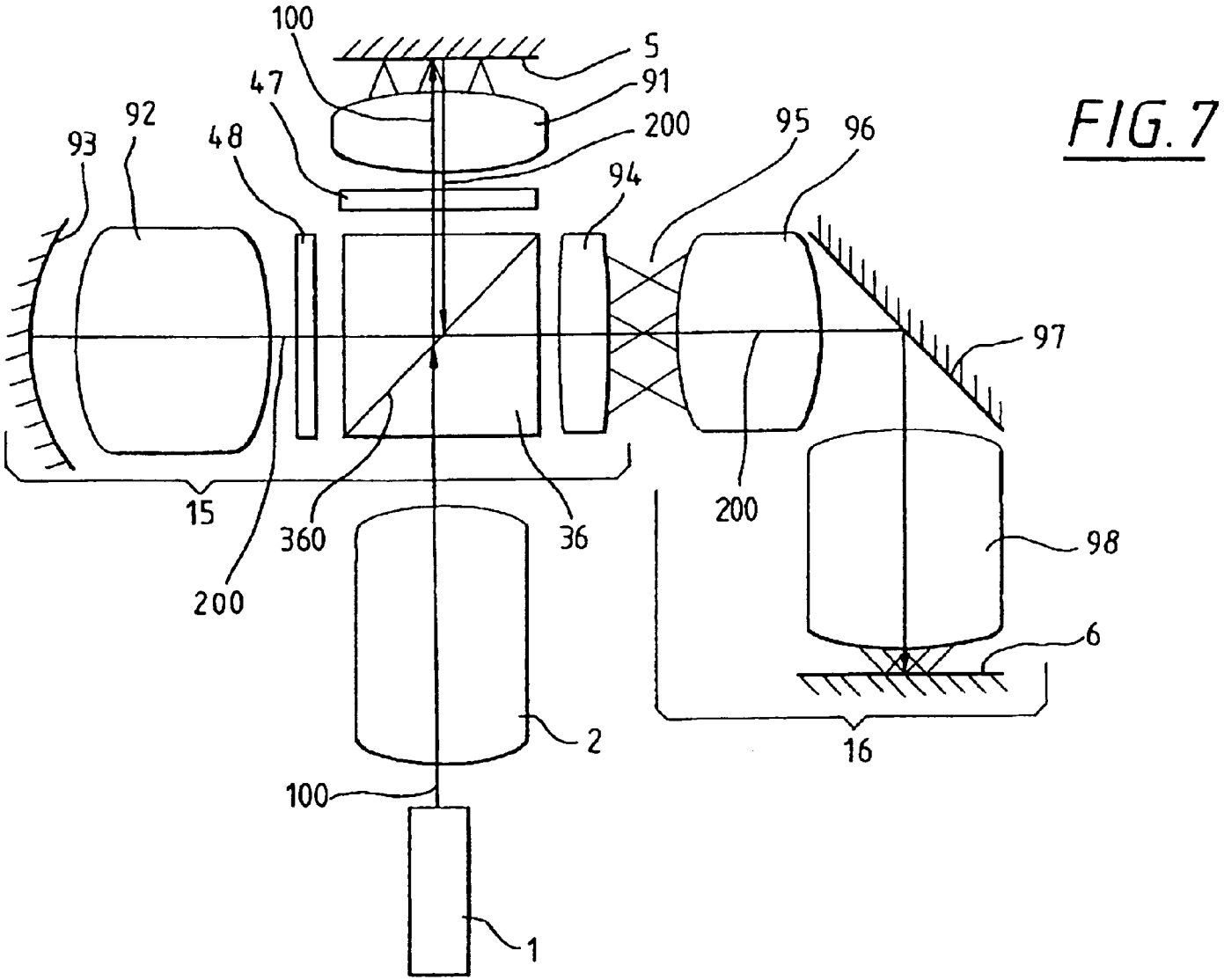
FIG. 7 shows a catadioptric reduction objective having an intermediate imaging optic wherein the illumination is coupled in via the beam splitter cube of the catadioptric reduction objective; and, FIG. 8 shows an embodiment for a catadioptric reduction objective having a beam splitter cube and an intermediate imaging optic.

Coupling in the illuminating light via a polarization beam splitter cube 36 can also be done in another class of objective designs as shown in FIG. 7. The reduction objective includes the following: a catadioptric component objective 15 having a polarization beam splitter cube 36, an intermediate image 95 and a refractive reduction objective 16. The catadioptric component objective 15 can be disposed after the reticle 5 as shown in FIG. 7 as well as forward of the wafer 6. In the catadioptric component objective 15, a polarization beam splitter cube 36 is already provided having a fourth and still unused face. Via this face, the illuminating light 100 can be coupled in.

The light coming from the illuminating unit 2 has to be very well polarized, advantageously to more than 95%, perpendicularly to the beam splitter surface 360. In this way, one avoids an unwanted reflection in the direction of wafer 6 whereby contrast and resolution of the projection objective would have been reduced.

A first λ/4 platelet 47 has to be mounted between polarization beam splitter cube 36 and reticle 5 so that the light rays of the imaging beam path 200 are polarized after passing through the λ/4 platelet 47 so that they are reflected at the polarization beam splitter cube 36 in the direction of concave mirror 93.

Optical elements 91, which overall have a positive refractive power, are disposed between reticle 5 and polarization beam splitter cube 36 so that the beam splitter surface 360 is passed through in the almost entirely collimated beam path.

A second λ/4 platelet 48 has to be introduced between polarization beam splitter cube 36 and concave mirror 93 so that the light rays of the imaging beam path 200 can, after the deflection at concave mirror 93, pass through the polarization beam splitter cube 36 undeflected in the direction of the intermediate image 95.

The optical elements 92 having an overall negative refractive power are disposed between the polarization beam splitter cube 36 and the concave mirror 93. The elements 92 are passed through by the light beam in two passthroughs and lead to a chromatic overcorrection. The concave mirror 93 affords the advantage that it introduces no chromatic aberrations and has an adequately positive refractive power so that the catadioptric component objective 15 overall has a positive refractive power.

If the polarization beam splitter cube 3 is passed through in the almost collimated beam path, then further optical elements 94 having overall positive refractive power are required ahead of the intermediate image 95 in order to generate the intermediate image.

One can omit optical elements 94 if the intermediate image 95 is already generated by the action of the concave mirror 93 and the optical elements 92 and if the collimated beam path within the polarization beam splitter cube 93 is omitted.

Usually, the object is imaged onto the intermediate image with an imaging scale of $\beta_1=-1.0\pm0.25$.

A refractive reduction imaging having an imaging scale of, for example, $\beta_2=0.25\pm0.15$ follows the intermediate image 95. In FIG. 7, the component objective between intermediate image 95 and wafer 6 comprises the optical elements (96, 98) and the deflecting mirror 97.

It is also possible to arrange the deflecting mirror 97 forward of the optical components 96.

The diameter of the illuminated field in the wafer plane 6 is, in this class of objectives, greater than 10 mm for an image end numerical aperture greater than 0.5.

Figure 8:
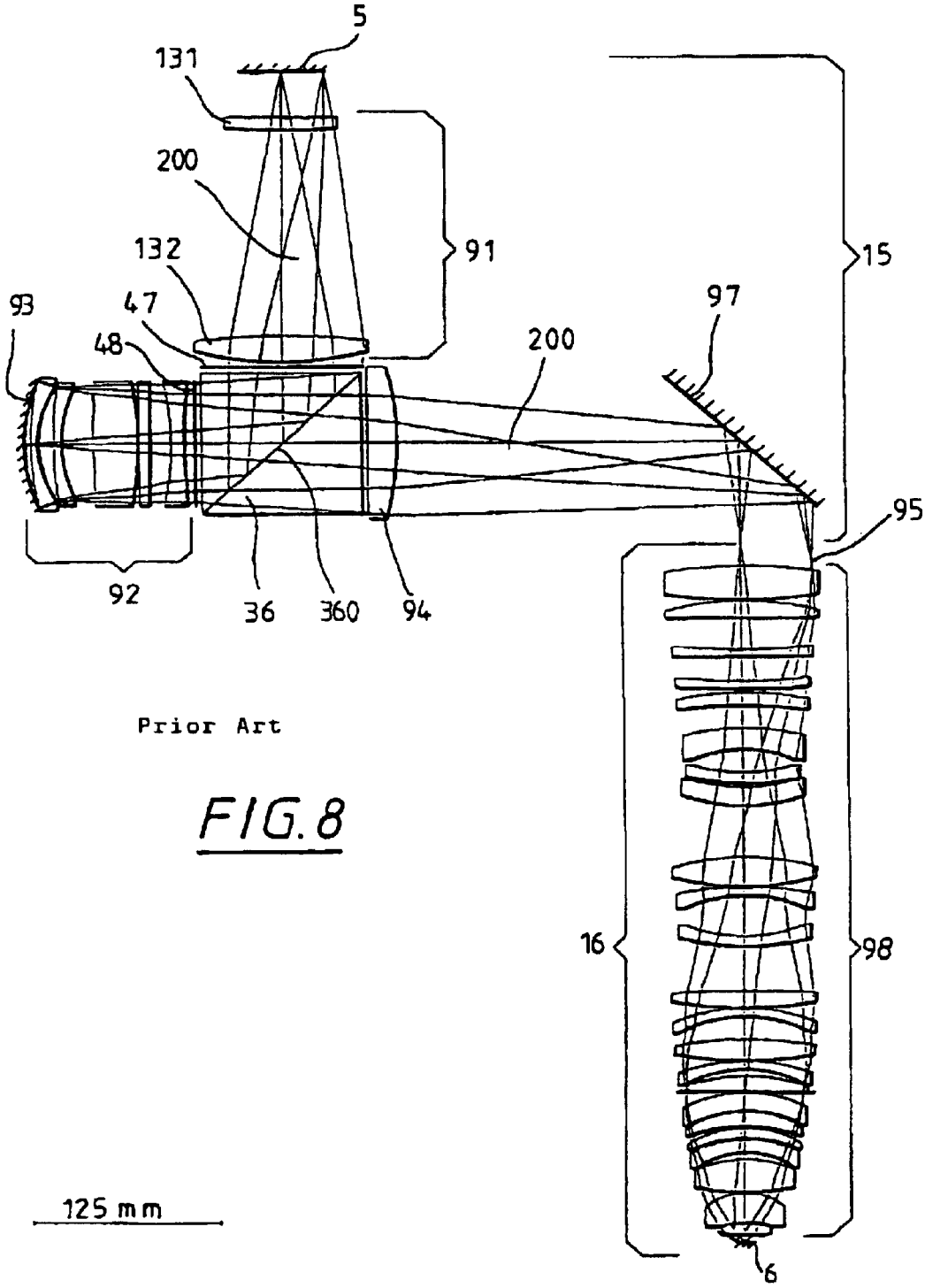
Prior Art FIG. 8

For the embodiment shown in FIG. 7 with beam splitter cube and intermediate image, FIG. 8 shows a specific embodiment for an image scale $\beta=-0.25$,for an image field having a diameter of 14.3 mm and for an image end numerical aperture of 0.7. The reference numerals in FIG. 8 correspond to the reference numerals in FIG. 7. The optical data are set forth in Table 1.

The embodiment of FIG. 8 is taken from U.S. patent application Ser. No. 09/711,256, filed Nov. 10, 2000 (now U.S. Pat. No. 6,424,471), incorporated herein by reference.

In Table 1, the surface 7 is assigned to the beam splitter surface 360 for the first contact and the surface 19 is assigned to the concave mirror 93. The surface 31 is assigned to the beam splitter surface 360 for the second contact and the surface 36 is assigned to the deflecting mirror 97. The surface 38 is assigned to the intermediate image 95. $SiO_2$ identifies quartz glass and $CaF_2$ identifies calcium fluoride monocrystals.

The optical elements 91 in this case comprise two converging lenses 131 and 132. The converging lens 132 is mounted close to the polarization beam splitter cube 3 and reduces the divergence of the peripheral rays. In this way, the substantially collimated beam path is produced within the polarization beam splitter cube 3. An almost telecentric chief ray trace is achieved at the reticle 5 with the converging lens 131 close to the reticle 5.

Table 2 provides the chief ray angles with respect to the surface normal in mrad for seven object heights in the reticle plane 5. The chief ray angles are positive when the chief rays run convergent to the optical axis after reflection at reticle 5. The maximum chief ray angle in this embodiment is only 0.5 mrad. The entry at the reticle is thereby almost perfectly telecentric.

The adaptation of the centroid ray angles of the illuminating beam path 100 in the illuminating system 2 to the chief ray angle of the projection objective is, in this case, especially simple because the illuminating beam path 100 and the imaging beam path 200 substantially overlap within the common components 91 between beam splitter cube 3 and reticle 5.

The polarization beam splitter cube 3 and the two converging lenses 131 and 132 are to be included in the design of the illuminating system 2. If the last component of the illuminating system 2 forward of the reticle is a REMA objective as disclosed in U.S. Pat. No. 5,982,558 or in U.S. Pat. No. 6,366,410, then the REMA objective can be so modified without great difficulty that a refractive cube is integrated for the polarization beam splitter cube 3 and a refractive planar plate is integrated for the λ/4 platelet 47 and the two converging lenses 131 and 132 are integrated into the field lens of the REMA objective.

An incoupling of the illuminating light 100 via the deflecting mirror 97 is in this case not possible. The incoupling of illuminating light via a polarization beam splitter cube or a polarization beam splitter plate is only possible when the light does not impinge on a further beam splitter surface after passing through this first beam splitter surface but is reflected after passthrough by possibly further optical elements. However, in the configuration of FIG. 8, if the illuminating light would be coupled in via the deflecting mirror 97, no reflecting surface would follow but a further polarization beam splitter surface 360 of the beam splitter cube 3. An incoupling would, in this case, be conceivable only via a geometric beam splitter plate or a geometric beam splitter cube. This, however, would lead to high transmission losses.

It is understood that the foregoing description is that of the preferred embodiments of the invention and that various changes and modifications may be made thereto without departing from the spirit and scope of the invention as defined in the appended claims.

TABLE 1

| Surface No. | Radius | Thickness | Mirror | Material |
|---|---|---|---|---|
| Reticle | ∞ | 35.000 | | |
| 1 | ∞ | 0.000 | | |
| 2 | ∞ | 10.000 | | SiO2 |
| 3 | −356.062 | 157.474 | | |
| 4 | 152.317 | 20.000 | | SiO2 |

TABLE 1-continued

| Surface No. | Radius | Thickness | Mirror | Material |
|---|---|---|---|---|
| 5 | −207.509 | 15.494 | | |
| 6 | ∞ | 46.000 | | SiO2 |
| 7 | ∞ | −46.000 | S | SiO2 |
| 8 | ∞ | −11.450 | | |
| 9 | 714.294 | −10.000 | | SiO2 |
| 10 | −233.153 | −14.054 | | |
| 11 | 11257.823 | −7.320 | | SiO2 |
| 12 | 5681.927 | −0.268 | | |
| 13 | −294.458 | −29.996 | | SiO2 |
| 14 | 2624.912 | −21.086 | | |
| 15 | 118.550 | −6.001 | | SiO2 |
| 16 | 372.661 | −9.646 | | |
| 17 | 89.532 | −6.000 | | SiO2 |
| 18 | 220.679 | −3.804 | | |
| 19 | 134.415 | 3.804 | S | |
| 20 | 220.679 | 6.000 | | SiO2 |
| 21 | 89.532 | 9.646 | | |
| 22 | 372.661 | 6.001 | | SiO2 |
| 23 | 118.550 | 21.086 | | |
| 24 | 2624.912 | 29.996 | | SiO2 |
| 25 | −294.458 | 0.268 | | |
| 26 | 5681.927 | 7.320 | | SiO2 |
| 27 | 11257.823 | 14.054 | | |
| 28 | −233.153 | 10.000 | | SiO2 |
| 29 | 714.294 | 11.450 | | |
| 30 | ∞ | 46.000 | | SiO2 |
| 31 | ∞ | 46.000 | | SiO2 |
| 32 | ∞ | 0.000 | | |
| 33 | ∞ | 11.000 | | |
| 34 | −6197.721 | 20.000 | | SiO2 |
| 35 | −220.469 | 289.683 | | |
| 36 | ∞ | −35.000 | S | |
| 37 | −283.115 | −27.145 | | SiO2 |
| 38 | 291.549 | −0.100 | | |
| 39 | −169.090 | −12.856 | | SiO2 |
| 40 | −2565.582 | −24.512 | | |
| 41 | 380.926 | −6.000 | | SiO2 |
| 42 | 3955.807 | −18.476 | | |
| 43 | 360.725 | −6.000 | | SiO2 |
| 44 | 890.059 | −2.724 | | |
| 45 | −179.574 | −11.560 | | SiO2 |
| 46 | −339.907 | −16.696 | | |
| 47 | −147.863 | −16.313 | | SiO2 |
| 48 | −65.738 | −18.352 | | |
| 49 | 103.683 | −7.718 | | SiO2 |
| 50 | 197.447 | −2.785 | | |
| 51 | 111.947 | −15.000 | | SiO2 |
| 52 | 106.337 | −38.908 | | |
| 53 | −152.812 | −22.411 | | SiO2 |
| 54 | 194.070 | −0.375 | | |
| 55 | −199.667 | −7.318 | | SiO2 |
| 56 | −93.343 | −30.485 | | |
| 57 | 89.838 | −7.125 | | SiO2 |
| 58 | 197.820 | −35.859 | | |
| 59 | −713.001 | −13.228 | | SiO2 |
| 60 | 274.158 | −0.375 | | |
| 61 | −106.260 | −6.375 | | SiO2 |
| 62 | −76.991 | −18.206 | | |
| 63 | −207.243 | −16.125 | | SiO2 |
| 64 | 265.977 | −0.375 | | |
| 65 | −105.982 | −6.938 | | SiO2 |
| 66 | −70.150 | −5.070 | | |
| 67 | −110.355 | −11.250 | | SiO2 |
| 68 | −337.355 | −1.500 | | |
| 69 | ∞ | 0.000 | | |
| 70 | −83.054 | −13.500 | | SiO2 |
| 71 | −64.019 | −0.100 | | |
| 72 | −60.890 | −13.500 | | SiO2 |
| 73 | −102.440 | −0.101 | | |
| 74 | −65.466 | −8.393 | | SiO2 |
| 75 | −75.287 | −0.523 | | |
| 76 | −74.115 | −10.249 | | SiO2 |
| 77 | −48.411 | −4.972 | | |
| 78 | −70.661 | −26.250 | | SiO2 |
| 79 | 135.365 | −0.038 | | |
| 80 | −38.281 | −23.828 | | CaF2 |
| 81 | −41.066 | −0.038 | | |

TABLE 1-continued

| Surface No. | Radius | Thickness | Mirror | Material |
|---|---|---|---|---|
| 82 | −46.927 | −9.292 | | CaF2 |
| 83 | 187.500 | −5.625 | | |
| Wafer | ∞ | 0.000 | | |

TABLE 2

| Object Height at Reticle (mm) | Chief Ray Angle at Reticle (mrad) |
|---|---|
| 28.7 | +0.29 |
| 26.8 | +0.36 |
| 24.9 | +0.41 |
| 20.3 | +0.49 |
| 14.4 | +0.47 |
| 10.1 | +0.38 |
| 0.0 | +0.00 |

What is claimed is:

1. A projection exposure system for microlithography, the projection exposure system comprising:

a light source;

an illuminating system mounted downstream of said light source for transmitting light from said light source as an illuminating beam along an illuminating beam path;

a reflective reticle;

a reduction objective defining an imaging beam path and being configured for imaging said reticle onto an object;

a beam splitter cube mounted in said imaging beam path for mutually superposing said illuminating beam path and said imaging beam path;

optical elements mounted on said imaging beam path between said reflective reticle and said beam splitter cube; and, said illuminating light beam having chief rays which impinge on said reflective reticle at an angle of incidence having a value up to |15| mrad.

2. The projection exposure system of claim 1, wherein said angle of incidence is up to |5| mrad.

3. The projection exposure system of claim 1, wherein said angle of incidence is up to |1.0| mrad.

4. The projection exposure system of claim 1, wherein said illuminating light beam has centroidal rays which, after being reflected at said reflective reticle, deviate from said chief rays by a maximum of |2.5| mrad.

5. A projection exposure system for microlithography, the projection exposure system comprising:

a light source;

an illuminating system mounted downstream of said light source for transmitting light from said light source as an illuminating beam along an illuminating beam path;

a reflective reticle;

a reduction objective defining an imaging beam path and being configured for imaging said reticle onto an object;

a beam splitter cube mounted in said imaging beam path for mutually superposing said illuminating beam path and said imaging beam path;

said beam splitter cube being a polarization beam splitter cube having a beam splitter surface; and, the light of said illuminating light beam, before entering said polarized beam splitter cube, being linearly polarized to more than 95% perpendicular to said beam splitter surface when said illuminating beam is not to be reflected at said beam splitter surface or being linearly polarized to more than 95% parallel to said beam splitter surface when the illuminating beam path is to be reflected at said beam splitter surface.

6. The projection exposure system of claim 5, wherein said reduction objective is a catadioptric objective.

7. The projection exposure system of claim 6, wherein said beam splitter cube is a first beam splitter cube; said reduction objective includes a concave mirror and a second beam splitter cube which separates the beam path to and from said concave mirror.

8. The projection exposure system of claim 6, wherein said first beam splitter cube defines a deflecting surface in the beam path of said reduction objective.

9. The projection exposure system of claim 8, wherein said reduction objective is configured to be free of an intermediate image.

10. The projection exposure system of claim 8, wherein said reduction objective is configured to have an intermediate image.

11. A projection exposure system for microlithography, the projection exposure system comprising:

a light source;

an illuminating system mounted downstream of said light source for transmitting light from said light source as an illuminating beam along an illuminating beam path;

a reflective reticle;

a reduction objective defining an imaging beam path and being configured for imaging said reticle onto an object;

a beam splitter cube mounted in said imaging beam path for mutually superposing said illuminating beam path and said imaging beam path;

said reduction objective including a first objective incorporating said beam splitter, an intermediate image; and, a second objective; and, said first objective having an imaging scale of −1.0±0.25 and said second objective having an intermediate imaging scale of −0.25±0.15.

12. The projection exposure system of claim 11, wherein said first objective and said second objective are configured to be purely refractive.

13. The projection exposure system of claim 11, wherein said first objective is configured to be purely refractive; and, said second objective is configured to be catadioptric.

14. A projection exposure system for microlithography, the projection exposure system comprising:

a light source;

an illuminating system mounted downstream of said light source for transmitting light from said light source as an illuminating beam along an illuminating beam path;

a reflective reticle;

a reduction objective defining an imaging beam path and being configured for imaging said reticle onto an object;

a beam splitter plate for mutually superposing said illuminating beam path and said imaging beam path;

said beam splitter plate having a first surface on which said imaging beam path is reflected in air and said beam splitter plate having a second surface; and, said first surface being a planar surface and said second surface being a corrective surface deviating from said planar surface.

15. The projection exposure system of claim 14, wherein said beam splitter plate is wedge shaped.

16. The projection exposure system of claim 14, wherein said illuminating beam is refractively corrected in passing through said beam splitter plate.

17. The projection exposure system of claim 16, wherein said beam splitter plate defines a deflecting surface in the beam path of said reduction objective.

18. The projection exposure system of claim 15, wherein only refractive elements and a $\lambda/4$ platelet are provided between said beam splitter plate and said reflective reticle.

19. The projection exposure system of claim 15, wherein said beam splitter plate is accommodated in a catadioptric reduction objective.

20. The projection exposure system of claim 19, wherein said catadioptric reduction objective is configured to be free of an intermediate image.

21. A method for making a microstructured object with a projection exposure system for microlithography which includes:

a light source; a reflective reticle defining a reticle plane;

an illuminating system mounted downstream of said light source for transmitting light from said light source along an illuminating beam path as an illuminating light beam having chief rays which impinge on said reflective reticle at an angle of incidence having a value up to |15| mrad;

a reduction objective defining an imaging beam path and an imaging plane and being configured for imaging said reticle onto the object; and, a beam splitter cube mounted in said imaging beam path for mutually superposing said illuminating beam path and said imaging beam path; and, the method comprising the steps of:

placing an object in the form of a substrate having a light-sensitive layer in said imaging plane;

inserting a mask containing a pattern thereon into said illuminating beam path at said reticle plane;

imaging said pattern onto said [lightsensitive] *light-sensitive* layer of said substrate utilizing said projection exposure system; and, exposing said light-sensitive layer by passing the light of said light source along said illuminating beam path thereby structuring said substrate.

22. A method for making a mcirostructured object with a projection exposure system for microlithography which includes:

a light source;

an illuminating system mounted downstream of said light source for transmitting light from said light source as an illuminating beam along an illuminating beam path;

a reflective reticle defining a reticle plane;

a reduction objective defining an imaging beam path and an imaging plane and being configured for imaging said reticle onto an object;

a beam splitter plate for mutually superposing said illuminating beam path and said imaging beam path;

said beam splitter plate having a first surface on which said imaging beam path is reflected in air and said beam splitter plate having a second surface; and, said first surface being a planar surface and said second surface being a corrective surface deviating from said planar surface; and, the method comprising the steps of:

placing an object in the form of a substrate having a light-sensitive layer in said imaging plane;

inserting a mask containing a pattern thereon into said illuminating beam path at said reticle plane;

imaging said pattern onto said light-sensitive layer of said substrate utilizing said projection exposure system; and, exposing said light-sensitive layer by passing the light of said light source along said illuminating beam path thereby structuring said substrate.

23. A projection exposure system for microlithography, the projection exposure system comprising:

a light source;

an illuminating system mounted downstream of said light source for transmitting light from said light source as an illuminating beam along an illuminating beam path;

a reflective reticle;

a reduction objective defining an imaging beam path and being configured for imaging said reticle onto an object;

a beam splitter cube mounted in said imaging beam path for mutually superposing said illuminating beam path and said imaging beam path;

said reduction objective being a catadioptric objective;

said beam splitter cube being a first beam splitter cube; and, said reduction objective including a concave mirror and a second beam splitter cube which separates the beam path to and from said concave mirror.

*24. A microlithographic projection exposure system comprising:*

*a light source;*

*an illuminating system;*

*a reticle; and*

*a reduction objective being configured for imaging said reticle onto an object, wherein said reduction objective includes:*

*a first objective;*

*an intermediate image;*

*a second objective comprising a concave mirror;*

*a second intermediate image;*

*a third objective in sequence; and*

*a deflecting mirror with two deflecting surfaces.*

*25. The system of claim 24, wherein said first objective has an imaging scale of one of the group consisting of −1.0±0.25 and −0.5±0.2.*

*26. A microlithographic projection exposure system comprising:*

*a light source;*

*an illuminating system;*

*a reticle; and*

*a reduction objective being configured for imaging said reticle onto an object, wherein said reduction objective includes:*

*a first objective;*

*an intermediate image;*

*a second objective comprising a concave mirror;*

*a second intermediate image;*

*a third objective in sequence; and*

*a deflecting mirror with two deflecting surfaces; wherein the reduction objective has an image end numerical aperture of a value of more than 0.8.*

*27. A projection exposure system for microlithography for imaging a reticle to a wafer plane with two intermediate image planes comprising:*

*a first intermediate imaging system for imaging of a reticle to a first intermediate image; and*

*a catadioptric intermediate imaging system having an object field;*

*wherein the object field of the catadioptric intermediate imaging system is decentered with respect to the optical axis, and having a deflecting mirror with two deflecting surfaces.*

*28. A system according to claim 27, wherein said catadioptric intermediate imaging system is arranged offset to the first intermediate imaging system.*

*29. A system according to claim 27, wherein said first intermediate imaging system has an imaging scale of one of the group consisting of −1.0±0.25 and −0.5±0.2.*

*30. A system according to claim 27, wherein said catadioptric intermediate imaging system comprises a concave mirror.*

*31. A system of claim 27, wherein the reduction objective has an image end numerical aperture of a value of more than 0.8.*

*32. A microlithographic projection exposure system comprising:*

*a light source;*

*an illuminating system;*

*a reticle; and*

*a reduction objective being configured for imaging said reticle onto an object;*

*wherein said reduction objective includes:*

*a first objective providing an intermediate image;*

*a catadioptric objective comprising a concave mirror;*

*a second intermediate image;*

*a purely refractive objective; and*

*a wafer plane parallel to said reticle.*

*33. The system of claim 32, wherein said first objective has an imaging scale of one of the group consisting of −1.0±0.25 and −0.5±0.2.*

*34. A system of claim 32, wherein the reduction objective has an image end numerical aperture of a value of more than 0.8.*

*35. A projection exposure system for microlithography for imaging a reticle to a wafer plane with two intermediate image planes comprising:*

*a first intermediate imaging system for imaging of the reticle to a first intermediate image;*

*a catadioptric intermediate imaging system for imaging the first intermediate image to a second intermediate image;*

*wherein the object field of the catadioptric intermediate imaging system is not centered with respect to the optical axis, said wafer plane being parallel to said reticle.*

*36. A system according to claim 35, wherein said catadioptric intermediate imaging system is arranged offset to the first intermediate imaging system.*

*37. A system according to claim 35, wherein said first intermediate imaging system has an imaging scale of one of the group consisting of −1.0±0.25 and −0.5±0.2.*

*38. A system according to claim 35, wherein said catadioptric intermediate imaging system comprises a concave mirror and a deflecting mirror with two deflecting surfaces.*

*39. A system according to claim 32, further comprising a deflecting mirror with two deflecting surfaces.*

*40. The system of claim 26, wherein said first objective has an imaging scale of one of the group consisting of −1.0±0.25 and −0.5±0.2.*

* * * * *